US007045807B2

(12) United States Patent
Choi

(10) Patent No.: US 7,045,807 B2
(45) Date of Patent: May 16, 2006

(54) FIELD EMISSION DEVICE, FIELD EMISSION DISPLAY ADOPTING THE SAME AND MANUFACTURING METHOD THEREOF

(75) Inventor: Jun-hee Choi, Gyeonggi-do (KR)

(73) Assignee: Samsung SDI Co., Ltd., Suwon-si (KR)

( * ) Notice: Subject to any disclaimer, the term of this patent is extended or adjusted under 35 U.S.C. 154(b) by 6 days.

(21) Appl. No.: 10/757,504

(22) Filed: Jan. 15, 2004

(65) Prior Publication Data

US 2004/0144969 A1 Jul. 29, 2004

(30) Foreign Application Priority Data

Jan. 29, 2003 (KR) ................................ 10-2003-0005928

(51) Int. Cl.
*H01L 29/06* (2006.01)

(52) U.S. Cl. ............................ 257/10; 257/11; 438/20

(58) Field of Classification Search .................. 257/10, 257/11; 438/20
See application file for complete search history.

(56) References Cited

U.S. PATENT DOCUMENTS 5,710,483 A 1/1998 Peng .......................... 313/497
2004/0145928 A1 * 7/2004 Seon et al. ................. 313/495

FOREIGN PATENT DOCUMENTS

KR 2000-7115 2/2000

* cited by examiner

*Primary Examiner*—Nathan J. Flynn
*Assistant Examiner*—Scott R Wilson
(74) *Attorney, Agent, or Firm*—Buchanan Ingersoll PC

(57) ABSTRACT

A field emission device, a field emission display for displaying images with good quality adopting the same, and a manufacturing method thereof are provided. The field emission device allows a mesh grid to closely contact the surface of a field emission array on a substrate and for this purpose, applies a tensile force to the mesh grid using a predetermined tension member.

11 Claims, 8 Drawing Sheets

(1 of 8 Drawing Sheet(s) Filed in Color)

FIELD EMISSION DEVICE, FIELD EMISSION DISPLAY ADOPTING THE SAME AND MANUFACTURING METHOD THEREOF

BACKGROUND OF THE INVENTION

This application claims the priority of Korean Patent Application No. 2003-5928, filed on Jan. 29, 2003, in the Korean Intellectual Property Office, the disclosure of which is incorporated herein in its entirety by reference.

1. Field of the Invention

The present invention relates to a field emission device, a field emission display adopting the same, and a manufacturing method thereof.

2. Description of the Related Art

A field emission device is a structure in which a cathode where an electron emission source is formed so as to emit electrons on a substrate, and a gate electron for inducing field emission are formed in an array. While electrons are emitted from an internal electron emission source of the field emission device, arcing occurs in an internal vacuum space between a cathode plate on which an electron emission source is provided and an anode plate having a phosphor screen where electrons are collided with one another. It is estimated that arcing occurs by discharge occurring when avalanche phenomena of a large amount of gases is instantaneously generated due to outgassing. Also, arcing often occurs even when chamber testing of a field emission array (FEA) formed on a cathode plate is performed or even when an anode voltage of 1 kV or more is applied to a combination of the cathode plate and an anode plate so as to perform testing of a field emission device. If surveying of the surface of the FEA in which arcing occurred is performed using an optical microscope, a damage caused by arcing is mainly observed in a gate edge of a gate hole. It is estimated this is because due to the pointed gate edge of the gate hole, arcing easily occurs under a high electric field. Arcing causes electrical short circuit between an anode to which an anode voltage having the highest electric potential is applied and a gate electrode to which a gate voltage relatively lower than the anode voltage is applied. Thus, the anode voltage is directly applied to the gate electrode, and a gate oxide used to electrically insulates the cathode electrode and the gate electrode and a resistive layer formed on the cathode electrode are damaged by this high voltage. This possibility more often occurs as the anode voltage increases. Consequently, arching possibility further increases when the anode voltage increases over 1 kV for the device having a simple structure in which the cathode plate and the anode plate are isolated by a spacer, and thus, it is difficult to achieve a high luminance field emission device that stably operates at a high voltage.

Meanwhile, such a conventional field emission device has a structure in which electrons are extracted by one gate electrode from the cathode and are simply accelerated toward a phosphor screen, and thus, emitted electron beams are collided with a phosphor deviating from a given pixel. This problem may be solved by an additional electrode for controlling electron beams emitted on the aforementioned electron beam path, for example, an additional electrode for focusing electron beams at a target position on a phosphor layer. This electrode corresponds to an additional grid electrode in the field emission device and is generally formed as a single body, unlike in a first gate electrode provided in a strip shape. The grid electrode of this single body serves to control electron beams as described above and prevent arcing which may occur in the aforementioned field emission device.

Korean Patent Application No. 2000-7115 and U.S. patent application Ser. No. 5,710,483 disclose a field emission device adopting a grid electrode as described previously.

A field emission device disclosed in U.S. Pat. No. 5,710,483 has a structure in which a grid electrode is formed by depositing a metallic material, whereas a field emission device disclosed in Korean Patent Application No. 2000-7115 has a structure in which an additional metallic mesh is suspended by a spacer between an anode plate and a cathode plate and the anode plate and the cathode plate are separated from each other.

As disclosed in U.S. Pat. No. 5,710,483, the size of the grid electrode formed by depositing the metallic material is limited by the size of deposition equipment. This limitation in the size of deposition equipment causes to limit the size of the field emission device which can be manufactured, and thus, it is not proper to manufacture a large-sized field emission device. Thus, an apparatus for deposing a metallic layer required to manufacture a large-sized field emission device must to be newly designed and manufactured, but vast costs are required. Meanwhile, the thickness of the grid electrode formed by the metallic deposition layer is limited to maximum 1.5 microns, and thus is not enough to effectively control electron beams.

In the field emission device disclosed in Korean Patent Application No. 2000-7115, a grid electrode (mesh grid) is made of a metallic plate. Thus, the size of the grid electrode is not limited as described above, and its thickness can be freely selected, and electron beams can be effectively controlled.

FIG. 1 is a cross-sectional view schematically illustrating an example of a conventional field emission device adopting a mesh grid. Referring to FIG. 1, a cathode plate 10 and an anode plate 20 are spaced apart from each other by a spacer 30. A space between the cathode plate 10 and the anode plate 20 is vacuumized. Thus, due to an internal negative pressure, the cathode plate 10 and the anode plate 20 are securely coupled to each other in the state that the spacer 30 is placed therebetween.

On the cathode plate 10, a cathode electrode 12 is formed on a rear plate 11, and a gate insulating layer 13 is formed on the cathode electrode 12. A through hole 13*a* is formed in the gate insulating layer 13, and the cathode electrode 12 is exposed to the bottom of the through hole 13*a*. An electron emission source 14 such as carbon nanotube (CNT) is formed on the cathode electrode 12 exposed through the through hole 13*a*. A gate electrode 15 having a gate hole 15*a* corresponding to the through hole 13*a* is formed on the gate insulating layer 13.

Meanwhile, on the anode plate 20, an anode electrode 22 is formed inside of a front plate 21, a phosphor layer 23 on the anode electrode 22 is formed opposite to the gate hole 15*a*, and a black matrix 24 is formed in the other portion of the anode electrode 22.

A mesh grid 40 is interposed between the cathode plate 10 and the anode plate 20 having the above structure. The mesh grid 40 is supported by the spacer 30 in the state that the mesh grid 40 is spaced apart from the cathode plate 10 and the anode plate 20 by a predetermined gap.

The mesh grid 40 has a fixing hole 41 through which the spacer 30 passes and an electron beam-controlling hole 42 which corresponds to the gate hole 15*a*. A binder 43 is filled in the fixing hole 41 so that the mesh grid 40 is coupled to the spacer 30.

A method for coupling a spacer in a conventional field emission device having the above structure will be described as below.

First, the spacer 30 is disposed in the anode plate 20 at a predetermined interval in the state that the phosphor layer 23 is not plactized. Next, the spacer 39, fixed in the anode plate 20, is inserted in the fixing hole 41 of the mesh grid 40 manufactured by extracting from a metallic plate, and then, the binder 43 for fixing the spacer 30 is filled in the fixing hole 41.

The mesh grid 40 and the spacer 30 are aligned, the binder 43 is cured, and then, the phosphor layer 23 is fired. The anode plate 20 and the cathode plate 10 are aligned with each other, and vacuum packaging is performed.

In the aforementioned conventional method, when a binder is cured at a temperature of about 120° C. and a phosphor layer is fired at a temperature of about 420° C., a mesh grid may be deformed and may be not well aligned with an anode plate. In particular, during vacuum packaging, secondary deformation of the mesh grid and scattering of alignment of the mesh grid with the anode plate occur at a process temperature of about 300° C. or more. Also, the mesh grid is separated from the cathode plate. Thus, as shown in FIG. 2, electrons emitted from one electron emission source do not pass through a corresponding hole of the mesh grid but stray electrons pass through another adjacent hole through a gap between the mesh grid and the cathode plate. The stray electrons are collided with another phosphor layer, and thus, color purity of an image may be lowered.

Due to the deformation and scattering of the mesh grid and generation of the stray electros, which may cause lowering of picture quality, the performance of the field emission device is deteriorated and thus, a new method for solving these problems is required.

SUMMARY OF THE INVENTION

The present invention provides a field emission device in which the deformation of a mesh grid is effectively prevented, a field emission display adopting the same, and a manufacturing method thereof.

The present invention also provides a field emission device in which the generation of stray electrons is structurally prevented, color purity is improved, and an image with high definition is embodied, a field emission display adopting the same, and a manufacturing method thereof.

According to one aspect of the present invention, there is provided a field emission device. The field emission device includes a substrate, a cathode electrode formed on the substrate and an electron emission source formed on the cathode electrode, a gate electrode having a gate hole corresponding to the electron emission source, a gate insulating layer which insulates the gate electrode and the cathode electrode from each other, a mesh grid which is placed on the gate electrode and in which an electron-controlling hole corresponding to the gate hole is formed, a tension member which allows the mesh grid to closely contact the gate electrode, fixes the mesh grid in the gate electrode, and applies a tensile force to the mesh grid, and a grid insulating layer which insulates the mesh grid and the gate electrode from each other.

According to another aspect of the present invention, there is provided a field emission display. The field emission display includes an anode plate on which an anode electrode and a phosphor layer are formed inside of a front plate, a cathode plate on which a field emission array including an electron emission source for emitting electrons corresponding to the phosphor layer and a gate electrode having a gate hole through which the electrodes pass is formed on a rear plate, a mesh grid which closely contacts the field emission array on the rear plate and in which an electron-controlling hole corresponding to the gate hole is formed, a tension member which fixes the mesh grid in the rear plate and applies a tensile force to the mesh grid, a grid insulating layer which insulates the mesh grid and the field emission array from each other, and a spacer provided between the cathode plate on which the mesh grid is installed and the anode plate corresponding to the cathode plate.

According to another aspect of the present invention, there is provided a method of manufacturing a field emission device. The method comprises a) forming a field emission array including an electron emission source for emitting electrons and a gate electrode having a gate hole through which the electrons pass, on a substrate, b) manufacturing an additional mesh grid in which an electron-controlling hole corresponding to the gate hole is formed, c) thermally expanding the substrate on which the field emission array is formed and the mesh grid to be fixed onto the substrate, d) fixing the thermally-expanded mesh grid onto the substrate using a tension member, and e) cooling the substrate and the mesh grid at room temperature.

According to another aspect of the present invention, there is provided a method of manufacturing a field emission display. The method comprises a) preparing an anode plate on which an anode electrode and a phosphor layer are formed inside of a front plate, b) preparing a cathode plate on which a field emission array including an electron emission source for emitting electrons corresponding to the phosphor layer and a gate electrode having a gate hole through which the electrodes pass inside of a rear plate, c) manufacturing an additional mesh grid in which an electron-controlling hole corresponding to the gate hole is formed, d) thermally expanding the rear plate on which the field emission array is formed and the mesh grid to be fixed onto the rear plate, e) fixing the thermally-expanded mesh grid onto the substrate using a tension member, and f) vacuumizing and sealing the anode plate and the cathode plate in the state that a spacer having a predetermined depth is interposed between the cathode plate and the anode plate.

In the field emission device, the field emission display adopting the same, and the manufacturing method thereof according to the present invention, the mesh grid is made of a metallic plate, and an amorphous silicon or silicon oxide layer is formed on a surface opposite to the cathode plate.

Preferably, the mesh grid is formed of Invar. According to an embodiment of the field emission device of the present invention, the grid insulating layer is formed on one side of the mesh grid, and preferably, a second grid insulating layer is formed of an insulating material on an upper surface of the grid insulating layer.

According to another embodiment of the present invention, the grid insulating layer, formed on both sides of the mesh grid, is formed of the same material, and preferably, the grid insulating layer is formed of amorphous silicon a-Si or silicon oxide ($SiO_2$).

According to another embodiment of the present invention, the tension member is formed in a ribbon shape, and one end of the tension member is connected to an edge of the mesh grid, and the other end of the tension member is fixed onto the substrate. The tension member has a thermal expansion coefficient higher than that of the mesh grid.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects and advantages of the present invention will become more apparent by describing in detail preferred embodiments thereof with reference to the attached drawings in which.

DETAILED DESCRIPTION OF THE INVENTION

Figure 4:
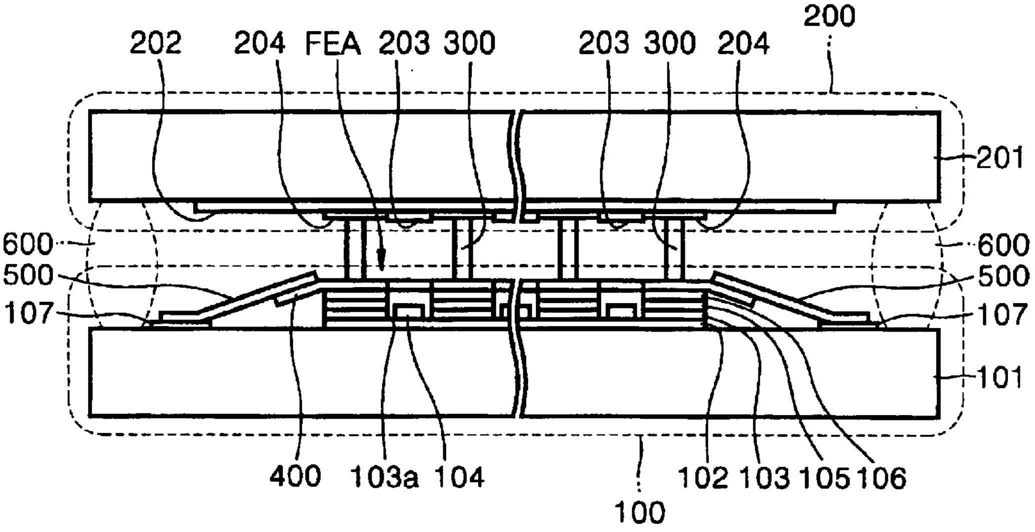
FIG. 4 is a cross-sectional view schematically illustrating a field emission display according to the present invention.
Figure 5:
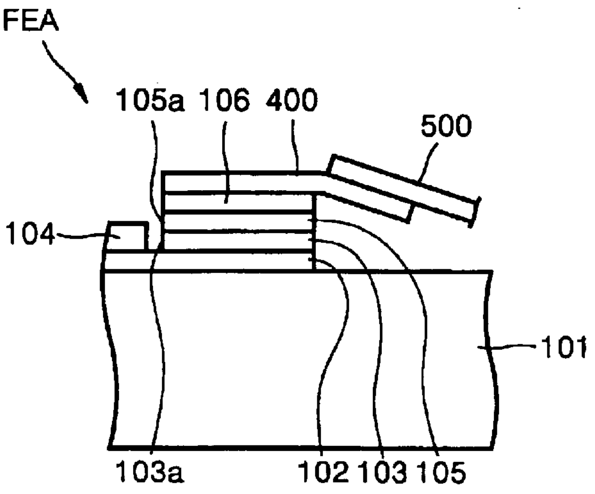
FIG. 5 is a partial enlarged view of the field emission display according to the present invention.

FIG. 4 is a cross-sectional view schematically illustrating a field emission display according to the present invention, and FIG. 5 is an enlarged view of a cathode plate employed in the field emission display according to the present invention. The structure shown in FIGS. 4 and 5 are greatly exaggerated for understanding, and in particular, an electron emission array including a cathode, a gate insulating layer, a gate electrode, and an electron emission source, and a mesh grid that contacts on the electron emission array are exaggerated.

Referring to FIG. 4, a cathode 100 in which a field emission array (FEA) is formed and an anode plate 200 in which a phosphor layer corresponding to the field emission array (FEA) is formed are isolated from each other by a spacer 300. The cathode plate 100 and the anode plate 200 are vacuumized and sealed with a sealing material 600, and thus a space therebetween is vacuumized. Thus, due to an internal negative pressure, the cathode plate 100 and the anode plate 200 are securely coupled to each other in the state that the spacer 300 is placed therebetween.

On the cathode plate 100, a cathode electrode 102 which is an element of the FEA, is formed on a rear plate 101 which is a substrate of the cathode plate 100, and a gate insulating layer 103 is formed on the cathode electrode 102. A through hole 103*a* is formed in the gate insulating layer 103, and the cathode electrode 102 is exposed to the bottom of the through hole 103*a*. An electron emission source 104 such as carbon nanotube (CNT) is formed on the cathode electrode 102 exposed through the through hole 103*a*. A gate electrode 105 having a gate hole 105*a* corresponding to the through hole 103*a* is formed on the gate insulating layer 103.

Meanwhile, on the anode plate 200, an anode electrode 202 is formed inside of a front plate 201, a phosphor layer 203 on the anode electrode 202 is formed opposite to the gate hole 105*a*, and a black matrix 204 is formed in the other portion of the anode electrode 202 so as to perform absorption of external light and prevent optical crosstalk.

A mesh grid 400 having an electron-controlling hole 401 having a thickness of about 100 microns is interposed between the cathode plate 100 and the anode plate 200 having the above structure. The mesh grid 400 closely contacts the surface of the FEA on the cathode plate 100 in the state that the mesh grid 400 is spaced apart from the cathode plate 200 by a predetermined gap. The mesh grid 400 is fixed onto the rear plate 101 in the state that the mesh grid 400 is tensioned by tension members 500 connected to the edge of the mesh grid 400

Figure 6:
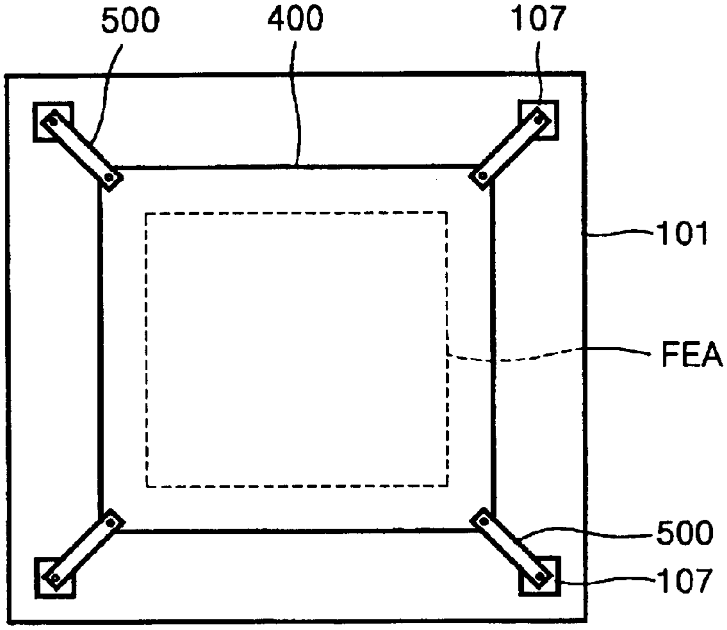
FIG. 6 is a plane view illustrating a fixed mesh grid in a field emission device according to the present invention.
Figure 8:
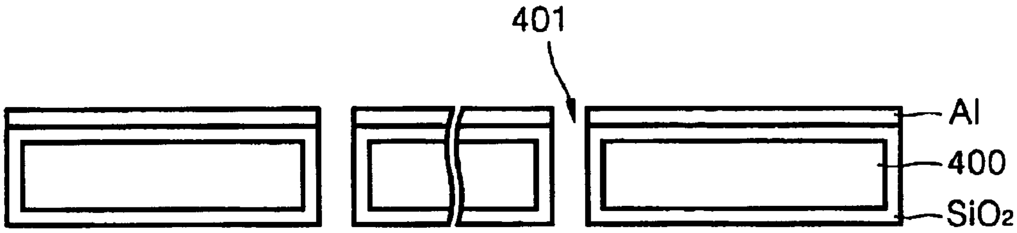
FIG. 8 is a cross-sectional view illustrating a mesh grid in the field emission device according to an embodiment of the present invention.
Figure 9:
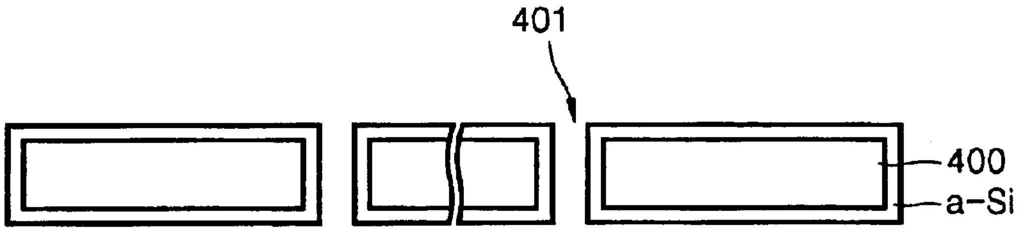
FIG. 9 is a cross-sectional view illustrating a mesh grid in the field emission device according to an embodiment of the present invention.

Referring to FIG. 6, the mesh grid 400 is fixed by a plurality of tension members 500 on the rear plate 101. One end of each of the tension members 500 is fixed in the mesh grid 400, and the other end of each of the tension members 500 is fixed in a fixing pad 107 provided on the rear plate 101. The fixing pad 107 may be formed when a gate electrode is formed by a metallic material while the FEA is formed on the rear plate 101. In this case, each of the tension members 500 has a thermal expansion coefficient higher than that of the mesh grid 400 and applies a predetermined tensile force to the mesh grid 400. Due to the tensile force, the mesh grid 400 closely contacts the surface of the FEA. A grid insulating layer 106 is interposed between the mesh grid 400 and the FEA. The grid insulating layer 106 may be formed of a deposition material on the gate electrode 105 provided on the uppermost layer of the FEA. Preferably, the grid insulating layer 106 may be formed of amorphous silicon a-Si or silicon oxide on the bottom side of the mesh grid 400, as shown in FIG. 8. More preferably, the grid insulating layer 106 is formed on both upper and lower sides of the mesh grid 400 and serves to protect the mesh grid 400. Here, as shown in FIG. 8, an insulating layer formed of silicon oxide serves as a simple electrical insulating layer. Thus, preferably, a conductive layer formed of metal such as aluminum (Al) for charge emission is formed on the upper surface of the insulating layer. However, as shown in FIG. 9, when amorphous silicon a-Si is used for the grid insulating layer, the grid insulating layer has the function of charge bleed off for emitting charges accumulated on the gate electrode or the mesh grid. Thus, an additional conductive layer as shown in FIG. 8 is not required.

Figure 7:
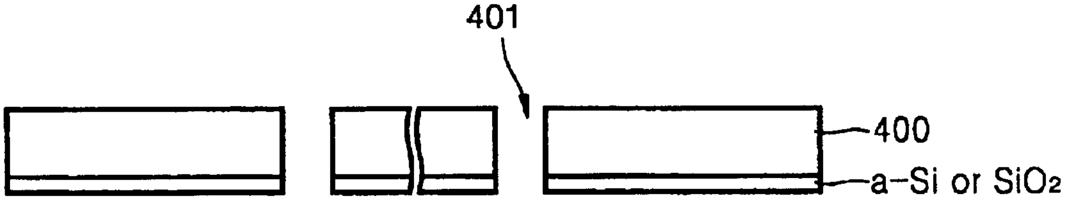
FIG. 7 is a cross-sectional view illustrating a mesh grid in the field emission device according to an embodiment of the present invention.

Meanwhile, when the grid insulating layer is formed only in one side of the mesh grid as shown in FIG. 7, the mesh grid may be distorted by a difference in physical characteristics such as thermal expansion coefficient and stress between the insulating layer and the mesh grid. However, as shown in FIGS. 8 and 9, when the grid insulating layer is formed on both sides of the metal grid 400, the deformation of the metal grid caused by the difference in physical characteristics can be effectively suppressed.

It is characteristic of the field emission device having the above structure according to the present invention in that the mesh grid, formed of additional parts from a metallic plate, closely contacts the surface of the FEA on the rear plate by the tension member.

Hereinafter, methods of manufacturing a field emission device according to the present invention and a field emission display adopting the same will be described.

The method of manufacturing the field emission device according to the present invention comprises the steps of forming a field emission array (FEA) including an electron emission source for emitting electrons on a substrate and a gate electrode having a gate hole through the electrons pass using an existing method and fixing the mesh grid using tension members on the surface of the field emission array (FEA) formed from a metallic plate in the state that the metallic grid is thermally expanded.

Thus, the method of manufacturing a FEA according to the present invention schematically comprises the following steps.

Figure 10A:
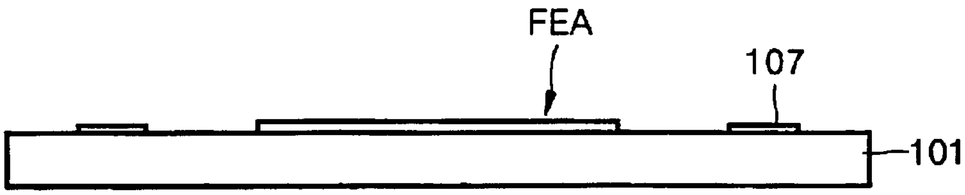
FIGS. 10A through 10D illustrate a method for fixing a mesh grid in a process for manufacturing a field emission device according to the present invention.

A) As shown in FIG. 10A, a cathode plate on which a FEA is provided is prepared on a substrate or a rear plate 101. In this state, a plurality of metallic fixing pads 107 are provided outside of the FEA on the rear plate 101. As described above, each of the metallic fixing pads 107 is formed when the FEA is manufactured.

Figure 10B:
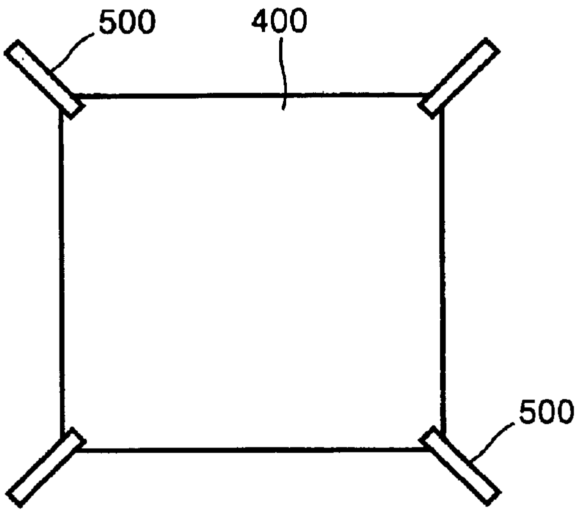

B) As shown in FIG. 10B, an additional metallic grid 400 in which an electron-controlling hole corresponding to a gate hole of the FEA is formed is manufactured.

Ribbon-shaped tension members 500 corresponding to the aforementioned fixing pads are attached to vertices of the mesh grid 400. As described above, each of the tension members 500 has a thermal expansion coefficient higher than that of the mesh grid 400. In this case, preferably, the thermal expansion coefficient of the mesh grid 400 is similar to that of the rear plate 101. For this purpose, the mesh grid 400 is formed of Invar.

Here, when the aforementioned grid insulating layer is formed on the mesh grid 400 itself according to an embodiment of the present invention, amorphous silicon a-Si or silicon oxide may be deposited by chemical vapor deposition (CVD). In this case, when the insulating layer is formed on both sides of the mesh grid 400, a gap is formed so that both sides of the mesh grid 400 contact a reactive gas.

Meanwhile, when the insulating layer is formed of a-Si and an additional conductive layer is needed, the insulating layer is formed, and then, an additional conductive layer may be formed by physical vapor deposition (PVD) such as directed electron beam deposition.

Figure 10C:
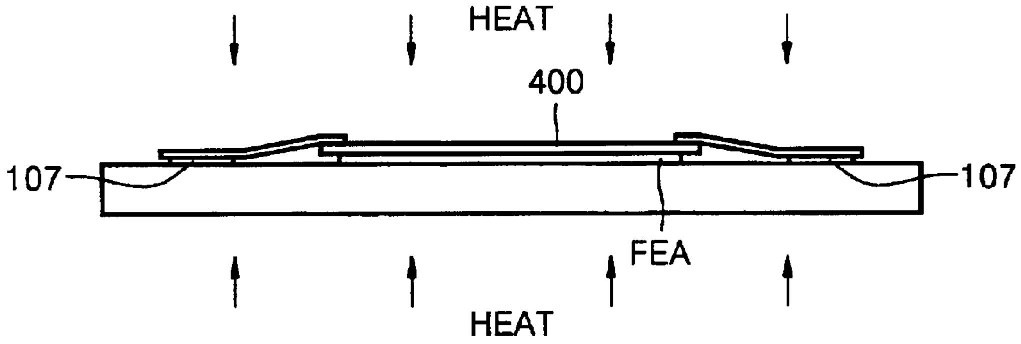

C) As shown in FIG. 10C, the mesh grid 400 is aligned on the FEA of the rear plate 101, and then, the rear plate 101 and the mesh grid 400 are thermally expanded by heat treatment.

Figure 10D:
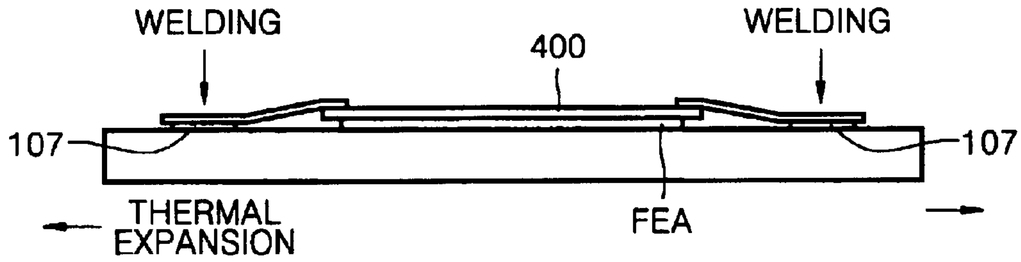

D) As shown in FIG. 10D, each of tension members 500 having one end fixed in the mesh grid 400 is fixed in each of the fixing pads 107 on the rear plate 101 by welding in the state that both the rear plate and the mesh grid 400 are thermally expanded. In this case, preferably, a heating temperature is over an operating temperature (in general, 50° C.) of the FEA.

E) After welding of the fixing pads 107 are completed as described above, the rear plate 101 and the mesh grid 400 are cooled.

If welding of the fixing pads 107 is performed in the state that both the rear plate and the mesh grid are thermally expanded and then the above structures are cooled, the largest amount of thermal contraction occurs in each of the tension members 500 having a high thermal expansion coefficient. Thus, a tensile force generated by each of the tension members 500 is applied to the mesh grid 400.

Figure 1:
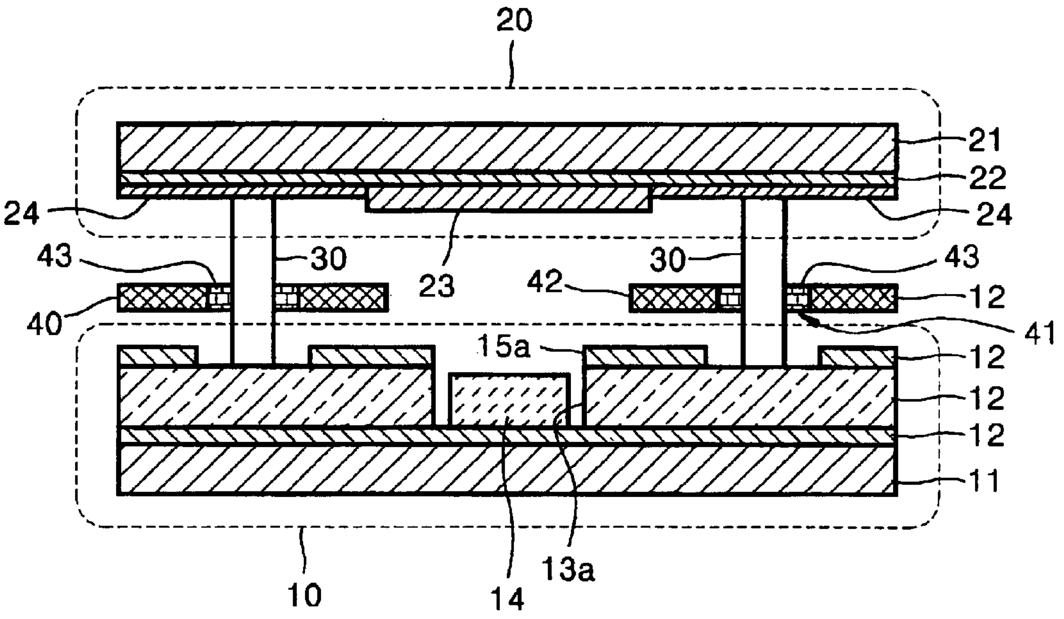
FIG. 1 (PRIOR ART)
FIG. 1 is a cross-sectional view schematically illustrating a conventional field emission device.
Figure 2:
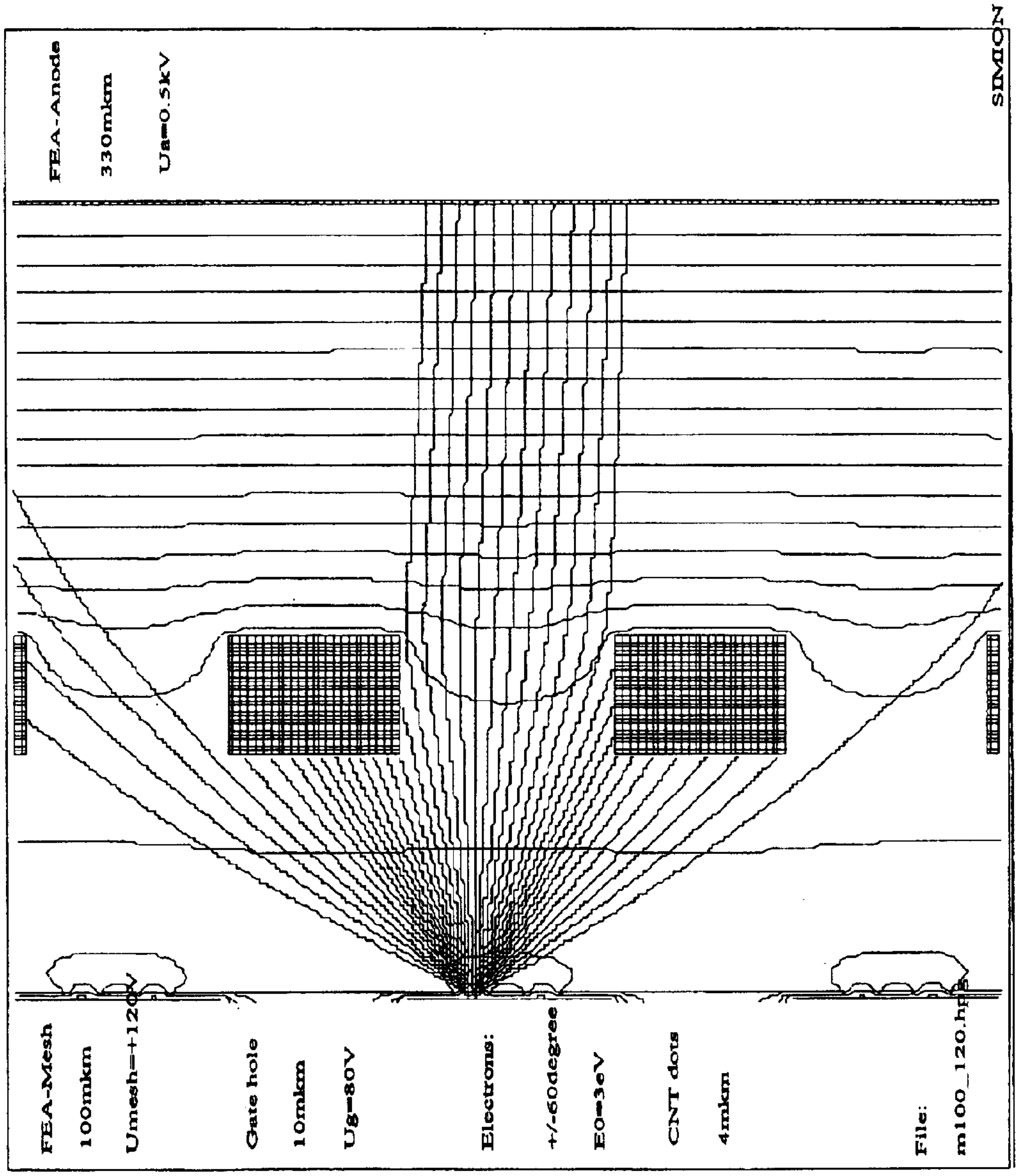
FIG. 2 (PRIOR ART)
FIG. 2 shows the result of simulation that exhibits generation of stray electrons in the conventional field emission device.
Figure 3:
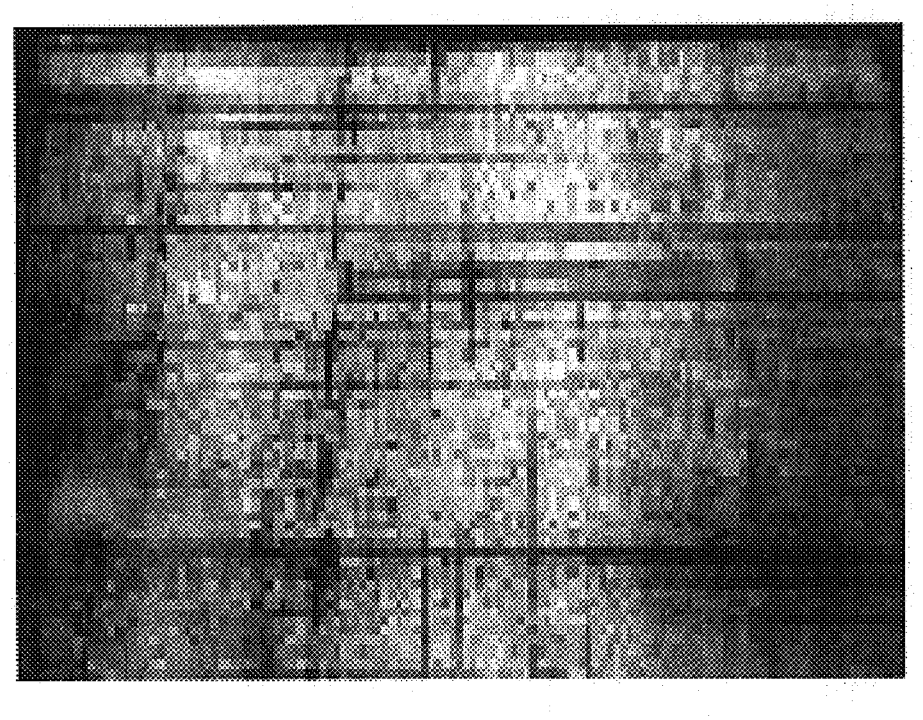
FIG. 3 (PRIOR ART)
FIG. 3 is a photo showing a screen of the conventional field emission device in which an image is smeared by a deformed mesh grid.
Figure 11:
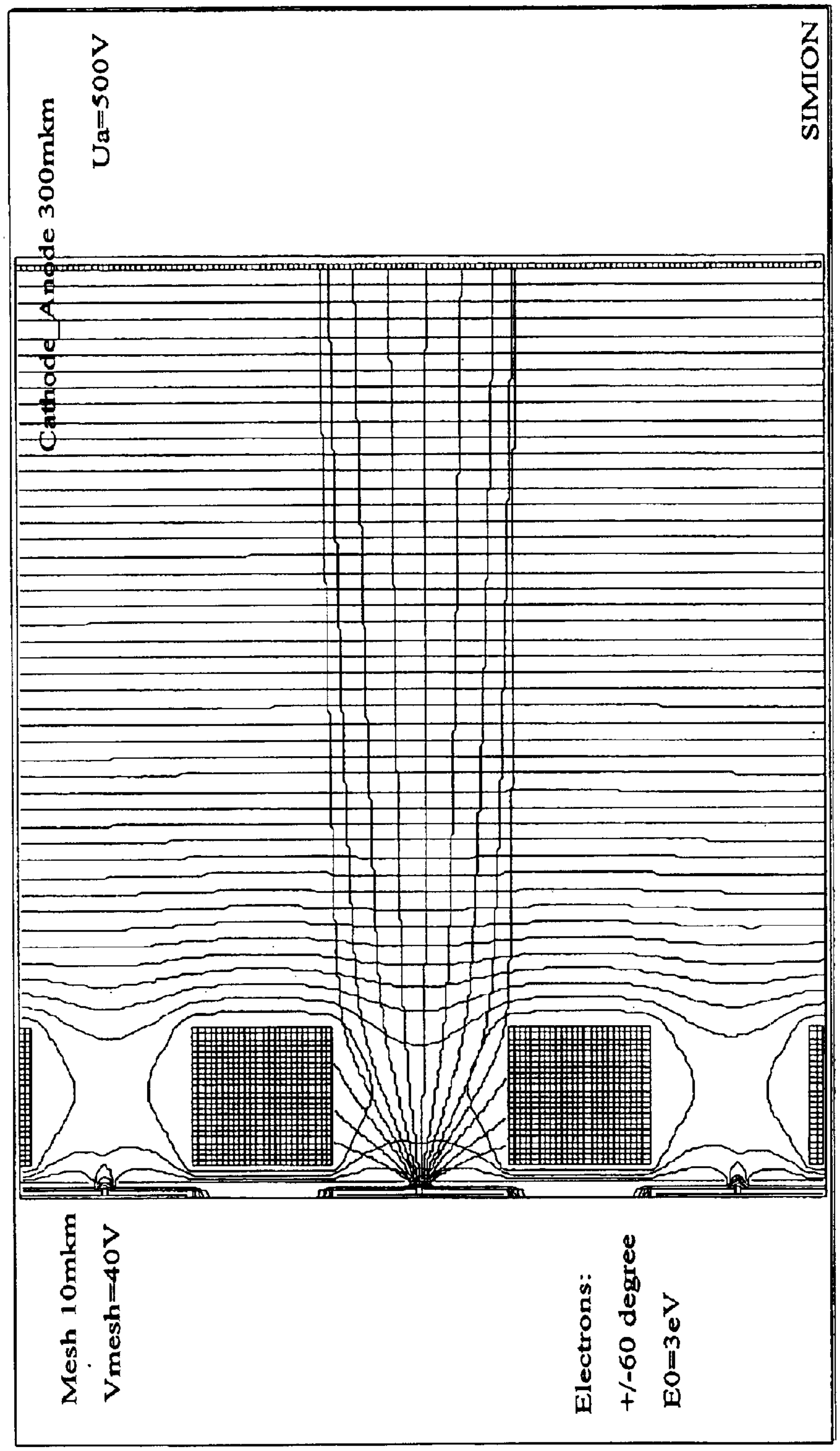
FIG. 11 shows the result of simulation that exhibits an electron-controlling structure of the field emission device according to the present invention.

In the field emission device manufactured by the aforementioned steps, unlike in the prior art, a mesh grid closely contacts the surface of a field emission array (FEA), and thus, a gap that causes the generation of stray electrons does not exist between the mesh grid and the field emission array (FEA). FIG. 11 shows the result of simulation that exhibits electron beam emission and control performed when a mesh grid closely contacts the surface of the FEA by a metallic plate according to the present invention. Comparing the result of simulation (FIG. 2) showing a mesh grid separated from a FEA by a predetermined gap according to the prior art to FIG. 11 according to the present invention, in the conventional field emission device, stray electrons occur, whereas in the field emission device according to the present invention, stray electrons do not occur. Also, as described above, the mesh grid is properly extended by the tension members, and thus, the deformation and distortion of the mesh grid do not occur like in the conventional field emission device.

Meanwhile, the field emission device manufactured by the aforementioned steps corresponds to a cathode plate of a field emission display.

The field emission display is manufactured by coupling the cathode plate to the additional anode plate in the state that the spacer is placed therebetween.

Hereinafter, a method of manufacturing a field emission display will be described.

A) A cathode plate is prepared by the aforementioned step, and simultaneously, an anode plate is prepared. The prepared anode plate 100 has a structure shown in FIG. 4 and is manufactured by a well-known method. In this case, a phosphor layer 230 formed inside of the anode plate 100 has not been fired yet.

B) The anode plate and the cathode plate are vacuumized and sealed in a state when a spacer having a predetermined height is interposed between the cathode plate and the anode plate. In this case, the spacer 300 is aligned with the anode plate 200 and attached to the anode plate 200. In this case, a binder 301 formed of a paste is used to attach the spacer 300 to the anode plate 200. The spacer 300 is heated in the state that the spacer 300 is attached to the anode plate 200, the phosphor layer 230 is fired, and simultaneously, the binder 301 is cured.

C) The anode plate and the cathode plate are vacuumized and sealed using a sealing material in the state that the spacer having a predetermined height is interposed between the cathode plate and the anode plate. In this case, a frit glass is used for the sealing material.

As described above, when the phosphor layer 230 and the binder 301 are fired, a mesh grid is excluded from the aforementioned steps. Thus, the deformation or distortion of the mesh grid like in the prior art during firing is completely prevented.

As described above, according to the present invention, the deformation of parts caused by firing a phosphor layer, in particular, the deformation of the mesh grid can be completely prevented. In particular, the mesh grid is not manufactured by deposition but by extracting from an additional metallic plate, and thus, the mesh grid is suitable for manufacturing of a large-sized field emission device. In addition, the mesh grid and a field emission array (FEA) closely contact each other, and thus, the generation of stray electrons is structurally prevented. In particular, the deformation and distortion of the mesh grid can be effectively prevented by a tensile force applied to the mesh grid, and thus, an image with good quality having no smear can be obtained.

While this invention has been particularly shown and described with reference to preferred embodiments thereof, it will be understood by those skilled in the art that various changes in form and details may be made therein without departing from the spirit and scope thereof as defined by the appended claims.

What is claimed is:

1. A method of manufacturing a field emission device, the method comprising:

(a) forming a field emission array including an electron emission source for emitting electrons and a gate electrode having a gate hole through which the electrons pass, on a substrate;

(b) providing an additional mesh grid in which an electron-controlling hole corresponding to the gate hole is formed;

(c) thermally expanding the substrate on which the field emission array is formed and the mesh grid to be fixed onto the substrate;

(d) fixing the thermally-expanded mesh grid onto the substrate using a tension member that applies a tensile force to the mesh grid; and (e) cooling the substrate and the mesh grid at room temperature.

2. The method of claim 1, wherein in (c), the rear plate and the field emission array are heated at a temperature higher than an operating temperature of the field emission array.

3. The method of claim 1, wherein in (a), a fixing pad for fixing the tension member is formed on the substrate.

4. The method of claim 1, wherein in (b), a grid insulating layer is formed at least one side of the mesh grid.

5. The method of claim 4, wherein the grid insulating layer is formed of one material selected from amorphous silicon and silicon oxide.

6. A method of manufacturing a field emission display, the method comprising:

a) preparing an anode plate on which an anode electrode and a phosphor layer are formed inside of a front plate;

b) preparing a cathode plate on which a field emission array including an electron emission source for emitting electrons corresponding to the phosphor layer and a gate electrode having a gate hole through which the electrodes pass inside of a rear plate;

c) providing an additional mesh grid in which an electron-controlling hole corresponding to the gate hole is formed;

d) thermally expanding the rear plate on which the field emission array is formed and the mesh grid to be fixed onto the rear plate;

e) fixing the thermally-expanded mesh grid onto the substrate using a tension member that applies a tensile force to the mesh grid; and f) vacuumizing and sealing the anode plate and the cathode plate in the state that a spacer having a predetermined depth is interposed between the cathode plate and the anode plate.

7. The method of claim 6, wherein in (d), the rear plate and the field emission array are heated at a temperature higher than an operating temperature of the field emission array.

8. The method of claim 6, wherein in (b), a fixing pad for fixing the tension member is formed on the substrate.

9. The method of claim 6, wherein in (c), a grid insulating layer is formed at least one side of the mesh grid.

10. The method of claim 9, wherein the grid insulating layer is formed of one material selected from amorphous silicon and silicon oxide.

11. The method of claim 6, wherein e) comprises:

fixing the spacer in the anode plate using a binder; and firing the phosphor layer together with the binder.

* * * * *